(12) United States Patent  
Moriyama

(10) Patent No.: US 12,095,461 B2  
(45) Date of Patent: Sep. 17, 2024

(54) SEMICONDUCTOR DEVICE

(71) Applicant: RENESAS ELECTRONICS CORPORATION, Tokyo (JP)

(72) Inventor: Daisuke Moriyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 129 days.

(21) Appl. No.: 18/054,978

(22) Filed: Nov. 14, 2022

(65) Prior Publication Data

US 2023/0155592 A1     May 18, 2023

(30) Foreign Application Priority Data

Nov. 16, 2021    (JP) .................... 2021-186709

(51) Int. Cl.
   *H03K 19/17*         (2006.01)
   *H03K 19/0185*     (2006.01)
   *H03K 19/17736*    (2020.01)
   *H03K 19/17768*    (2020.01)

(52) U.S. Cl.
   CPC ............... *H03K 19/17768* (2013.01); *H03K 19/018564* (2013.01); *H03K 19/17744* (2013.01)

(58) Field of Classification Search
   CPC ..... H03K 19/018564; H03K 19/17744; H03K 19/17768
   See application file for complete search history.

(56) References Cited

U.S. PATENT DOCUMENTS

| 6,101,621 | A | * | 8/2000 | Kondo | .................... G06F 7/507 |
|---|---|---|---|---|---|
| | | | | | 716/108 |
| 9,667,410 | B2 | * | 5/2017 | Oshida | .................... H04L 9/002 |
| 10,423,417 | B2 | * | 9/2019 | Bailey | ................... G06F 11/167 |
| 2021/0141697 | A1 | * | 5/2021 | Chin | .................... G06F 11/1076 |
| 2023/0055743 | A1 | * | 2/2023 | Yagi | ..................... G06F 11/1633 |

FOREIGN PATENT DOCUMENTS

JP     2017-058777 A     4/2016

* cited by examiner

*Primary Examiner* — Kurtis R Bahr
(74) *Attorney, Agent, or Firm* — Rimon P.C.

(57) ABSTRACT

A semiconductor device includes: an arithmetic circuit that repeats an operation related to a cryptographic processing for the predetermined number of rounds; a holding circuit that holds data related to the number of rounds of an operation of the arithmetic circuit; a judgement circuit that determines whether the number of rounds is the predetermined number of rounds; and an output buffer circuit that outputs the arithmetic result data of the arithmetic circuit when the judgement circuit determines that the number of rounds is the predetermined number. It is configured to duplicate the holding circuit, and not to output the arithmetic result data when two outputs of the duplicated holding circuit are not matched.

9 Claims, 6 Drawing Sheets

SEMICONDUCTOR DEVICE

CROSS-REFERENCE TO RELATED APPLICATIONS

The present application claims priority from Japanese Patent Application No. 2021-186709 filed on Nov. 16, 2021, the content of which is hereby incorporated by reference to this application.

BACKGROUND

The present disclosure relates to a semiconductor device, for example, is applicable to a semiconductor device provided with a cryptographic processing circuit.

A cryptographic algorithm includes, for example, an AES (Advanced Encryption Standard). The AES is a block cipher of a common key system in which a key length and a block length are variable. As a parameter, the key length has three types, e.g., 128 bits, 192 bits, or 256 bits, and the block length has one type, e.g., only 128 bits. Thus, the three types are notated as "AES-128", "AES-192", and "AES-256" by the key length.

In a processing specified in a cryptographic algorithm, a wide range of research has been conducted on how much security is reduced when the processing is less than the given number of loops. For example, the latest research results include the following reports. In the AES-128, the normal number of loops is 11 rounds, but if this is reduced to 5 rounds, a key recovery attack can be performed with a computation amount of about $2^{22}$. In the SHA-256 (Secure Hash Algorithm 256-bits), the normal number of loops is 64 rounds, but if this is reduced to 31 rounds, collisions will be found with a computation amount of about $2^{65.5}$. At the research level, the processing does not discuss that the processing becomes a behavior falling below the given number of loops (the number of rounds) in a case of what has happened.

SUMMARY

As disclosed in Patent Document 1 (Japanese Patent Application Laid-open No. 2016-58777), use of a device performing fault injection by a laser or the like makes it possible to perform an attack such as inverting a specific bit. Therefore, if the specifications of the cryptographic algorithm are implemented as they are, the behavior falling below the number of rounds may be realized by a fault injection attack.

The other problems and novel characteristics of the present invention will be apparent from the description of the present specification and the accompanying drawings.

The following is a brief description of an outline of the typical invention disclosed in the present application. That is, a semiconductor device includes: an arithmetic circuit repeating an operation related to a cryptographic processing for a predetermined number of rounds; a holding circuit holding data related to the number of rounds of the operation of the arithmetic circuit; a judgement circuit determines whether the number of rounds is the predetermined number of rounds; and an output buffer circuit outputting arithmetic result data of the arithmetic circuit when the judgement circuit determining that the number of rounds is the predetermined number of rounds. The semiconductor device is configured: to duplicate the holding circuit; and not to output the arithmetic result data when two outputs of the duplicated holding circuit are not matched.

According to the above-mentioned semiconductor device, the behavior falling below the number of rounds can be reduced by the fault injection attack.

DETAILED DESCRIPTION

Figure 1:
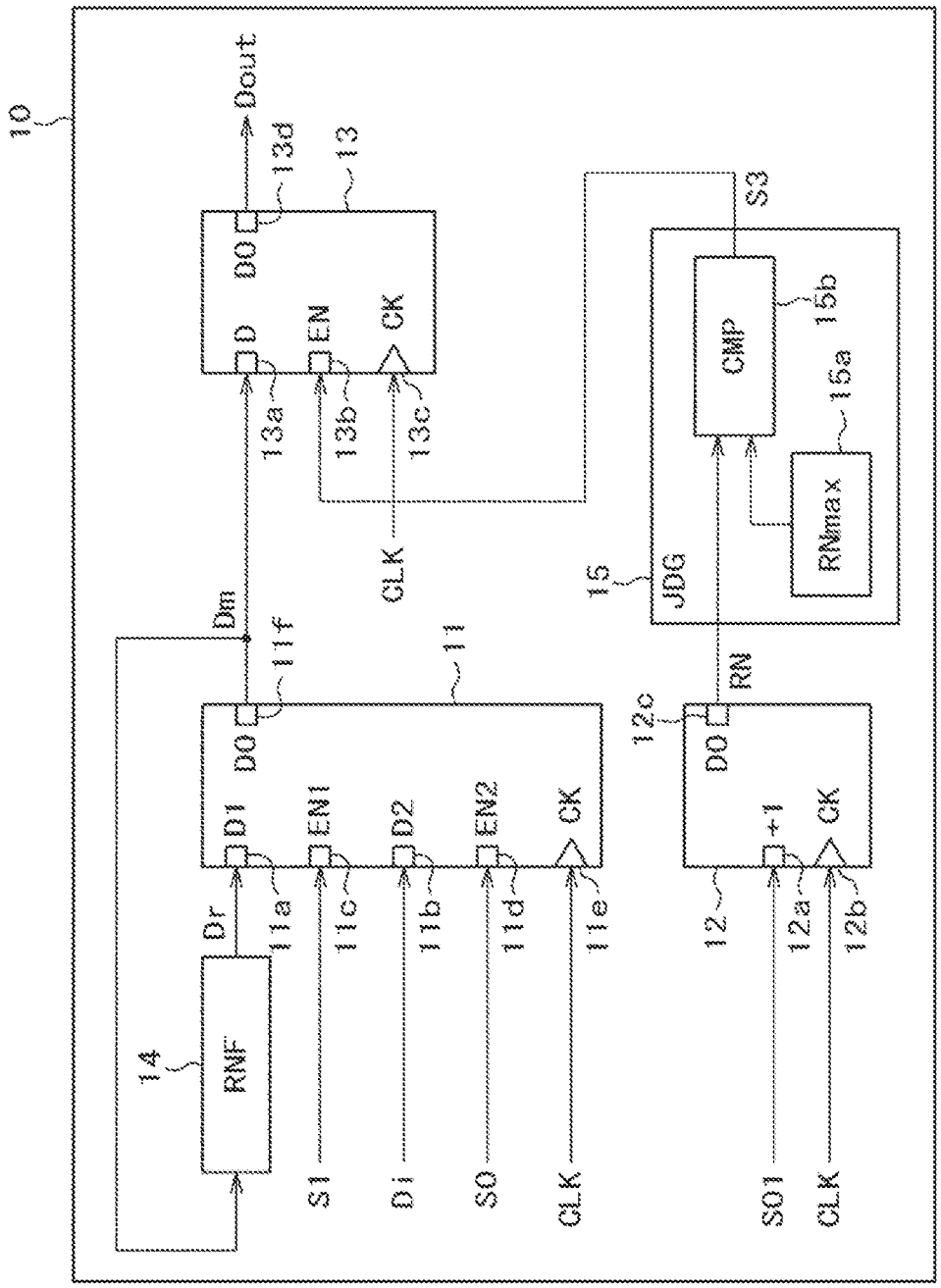
FIG. 1 is a block diagram showing a configuration of a cryptographic IP core in a comparative example.

Hereinafter, a comparative example and embodiments will be described with reference to the accompanying drawings. However, in the following description, the same components are denoted by the same reference characters, and a repetitive description thereof may be omitted.

First, in order to clarify the present embodiment, an outline of a flow of an encryption processing will be described by using an AES as an example. Encryption is configured from the following processings:

(a) Dividing input data and replacing the divided data (SubBytes);
(b) Replacement of data positions byte-by-byte (ShiftRows);
(c) Data conversion by arithmetic processing (MixColumns); and
(d) Arithmetic processing (AddRoundKey).

The above-mentioned processings (a) to (d) are regarded as one round, and encryption is performed by repeating the predetermined number of rounds according to a key length. Decoding is performed by reverse-converting the above-mentioned processings (a) to (d) in reverse order.

Next, a configuration of a cryptographic IP core (Intellectual Property Core) that realizes the above-mentioned encryption processing will be described with reference to FIG. 1. FIG. 1 is a block diagram showing a configuration of a cryptographic IP core in a comparative example.

A cryptographic IP core 10 is built in a semiconductor device such as a microcontroller. The cryptographic IP core 10 includes a first flip-flop 11, a second flip-flop 12, a third flip-flop 13, a round function circuit (RNF) 14, and a judgement circuit (JDG) 15.

The first flip-flop 11 has a first data input terminal (D1) 11*a*, a second data input terminal (D2) 11*b*, a first enable input terminal (EN1) 11*c*, a second enable input terminal (EN2) 11*d*, a clock input terminal (CK) 11*e*, and a data output terminal (DO) 11*f*. Output data (Dr) of the round function circuit 14 is inputted in the first data input terminal (D1) 11*a*. Initial data (Di) is inputted in the second data input terminal (D2) 11*b*. A signal (S1) indicating that an arithmetic processing is in progress is inputted in the first enable input terminal (EN1) 11*c*. A signal (S0) indicating a start of the arithmetic processing is inputted in the second enable input terminal (EN2) 11*d*. A clock signal (CLK) is inputted in the clock input terminal (CK) 11*e*.

When the signal (S1) indicating that the arithmetic processing is in progress is activated (for example, at a high level) at a rising or falling edge of the clock signal (CLK), the first flip-flop 11 captures output data of the round function circuit 14 from the first data input terminal (D1) 11a. Further, when the signal (S0) indicating the start of the arithmetic processing is activated (for example, at a high level) at the rising or falling edge of the clock signal (CLK), the first flip-flop 11 captures the initial data (Di) from the second input terminal (D2) 11b. The first flip-flop 11 holds intermediate data or final data of the encryption processing and outputs, as output data (Dm), the intermediate data or the final data from the data output terminal (DO) 11f.

The second flip-flop 12 has an increment enable input terminal (+1) 12a, a clock input terminal (CK) 12b, and a data output terminal (DO) 12c. An input signal (S01) in which the signal (S0) indicating the start of the arithmetic processing and the signal (S1) indicating that the arithmetic processing is in progress are logically summed is inputted in the increment enable input terminal (+1) 12a. The clock signal (CLK) is inputted in the clock input terminal (CK) 12b.

The second flip-flop 12 captures the input signal (S01) at the rising or falling edge of the clock signal (CLK). When the input signal (S01) is activated (for example, at a high level), it is incremented. The second flip-flop 12 holds the number of rounds and outputs the number of rounds (RN) from the data output terminal (DO) 12c.

The third flip-flop 13 has a data input terminal (D) 13a, an enable input terminal (EN) 13b, a clock input terminal (CK) 13c, and a data output terminal (DO) 13d. The output data (Dm) of the first flip-flop 11 is inputted in the data input terminal (D) 13a. An arithmetic end signal (S3), which is an output signal of the judgement circuit 15, is inputted in the enable input terminal (EN) 13b. The clock signal (CLK) is inputted in the clock input terminal (CK) 13c.

When the arithmetic end signal (S3) is activated (for example, at a high level) at the rising or falling edge of the clock signal (CLK), the third flip-flop 13 captures the output data (Dm) of the first flip-flop 11 from the data input terminal (D) 13a. The third flip-flop 13 constitutes an output buffer and outputs data (Dout) from the data output terminal (DO) 13d.

The round function circuit 14 is an arithmetic circuit that performs the above-mentioned processings (a) to (d) to the initial data (Di) and the output data (Dm) as the intermediate data.

The judgement circuit 15 includes a circuit 15a, in which the maximum value (RNmax) of the number of rounds corresponding to the key length is stored, and a comparison circuit 15b, and is a circuit for determining whether the number of rounds has reached a predetermined value (maximum value). The judgement circuit 15 activates the arithmetic end signal (S3) when the number of rounds reaches a predetermined value.

When the fault injection attack is executed on the second flip-flop 12, for example, bit inversion may occur at the most significant bit (leftmost bit) in 4-bit binary data as shown in the following abnormal operation:

Normal operation: 0000→0001→0010→0011; and
Abnormal operation: 0000→0001→1010→1011.

In that case, an output for a short processing of 8 rounds in length will be observed, and a reduced round attack becomes possible.

Thus, in the present embodiment, duplicated is a circuit of the following (A), a circuit of the following (A) and the following (B), or a circuit of the following (A) to the following (C) among the cryptographic IP cores in the comparative example. This is, the cryptographic IP core in the present embodiment does not duplicate all the circuits.

(A) A circuit for managing the number of rounds (second flip-flop 12);
(B) A circuit for comparison of whether the number of rounds given in the specifications has been calculated (judgment circuit 15); and
(C) A circuit for forming an output buffer (third flip-flop).

In the present embodiment, since a part of the circuit of the cryptographic IP core is duplicated, an increase in area is about 1 to 2%, but the security risk due to the fault injection attack can be reduced. Consequently, provided can be a highly secure cryptographic IP core that can prevent one of side channel countermeasures without mostly increasing a cost associated with the increase in area.

First Embodiment

Figure 2:
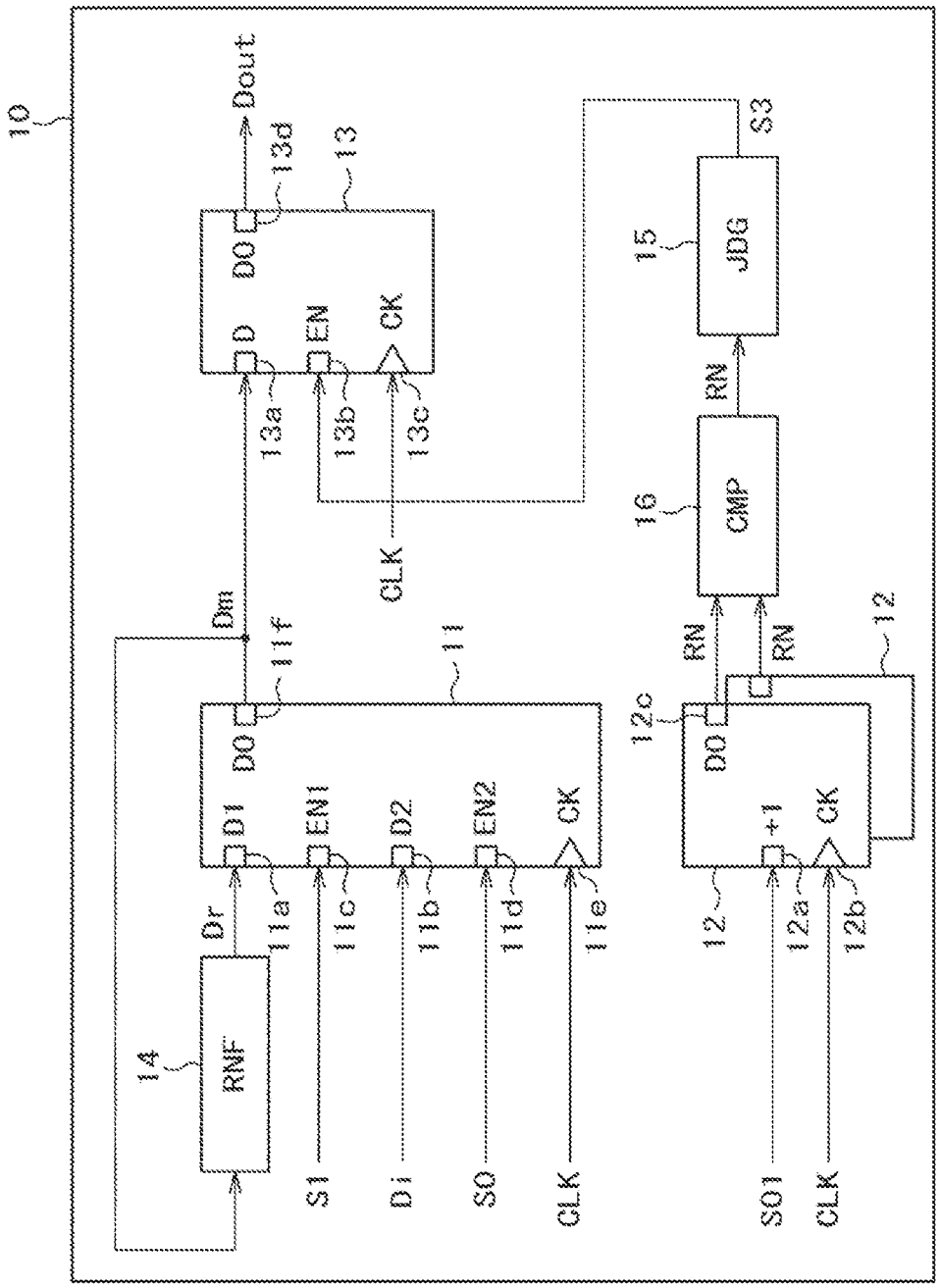
FIG. 2 is a block diagram showing a configuration of a cryptographic IP core in a first embodiment.

A cryptographic IP core in a first embodiment will be described with reference to FIG. 2. FIG. 2 is a block diagram showing a configuration of a cryptographic IP core in a first embodiment.

A cryptographic IP core 10 in a first embodiment has a configuration of duplicating the second flip-flop 12 which is the circuit of the above-mentioned (A). The cryptographic IP core 10 in the first embodiment further includes another second flip-flop 12 and a comparison circuit (CMP) 16 with respect to the cryptographic IP core in the comparative example. The comparison circuit 16 compares the outputs of the two second flip-flops 12, and outputs an output (RN) of the second flip-flops 12 to the judgement circuit 15 when the two outputs are matched. When the two outputs are not matched, the comparison circuit 16 prevents the judgement circuit 15 from activating the arithmetic end signal (S3).

If the output of the second flip-flop 12 changes due to the fault injection attack, there is a high possibility that the outputs of the two second flip-flops 12 will not be matched. By detecting that the two outputs are not matched, an arithmetic result cannot be outputted from the third flip-flop 13, and the reduced round can be suppressed.

Third Embodiment

Figure 3:
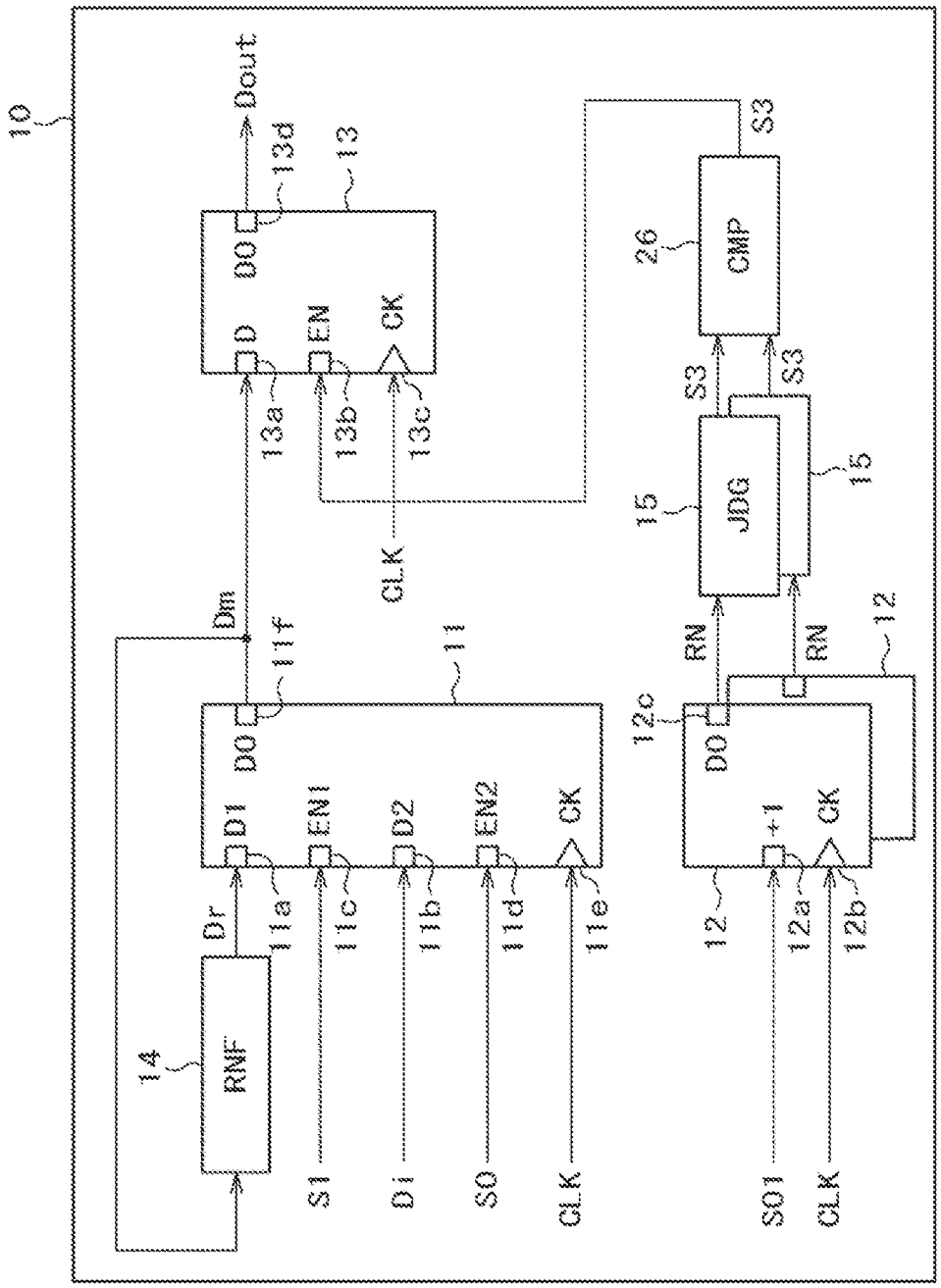
FIG. 3 is a block diagram showing a configuration of a cryptographic IP core in a second embodiment.

A cryptographic IP core in a second embodiment will be described with reference to FIG. 3. FIG. 3 is a block diagram showing a configuration of a cryptographic IP core in a second embodiment.

A cryptographic IP core 10 in a second embodiment has a configuration of duplicating the second flip-flop 12 which is the circuit of the above-mentioned (A) and the judgement circuit 15 which is the circuit of the above-mentioned (B). The cryptographic IP core 10 in the second embodiment further includes another second flip-flop 12, another judgement circuit 15, and a comparison circuit (CMP) 26 with respect to the cryptographic IP core in the comparative example. The comparison circuit 26 compares outputs of the two judgement circuits 15, and outputs the arithmetic end signal (S3), which is the output of the judgement circuit 15, to the third flip-flop 13 when the two outputs are matched with each other. When the two outputs are not matched, the comparison circuit 26 deactivates the arithmetic end signal (S3) and outputs it.

When the output of the second flip-flop 12 or the judgement circuit 15 changes due to the fault injection attack, there is a more highly possibility that the outputs of the two determination circuits 15 will not be matched. By detecting that the two outputs are not matched, the arithmetic result cannot be outputted from the third flip-flop 13, and the reduced round can be suppressed.

Third Embodiment

Figure 4:
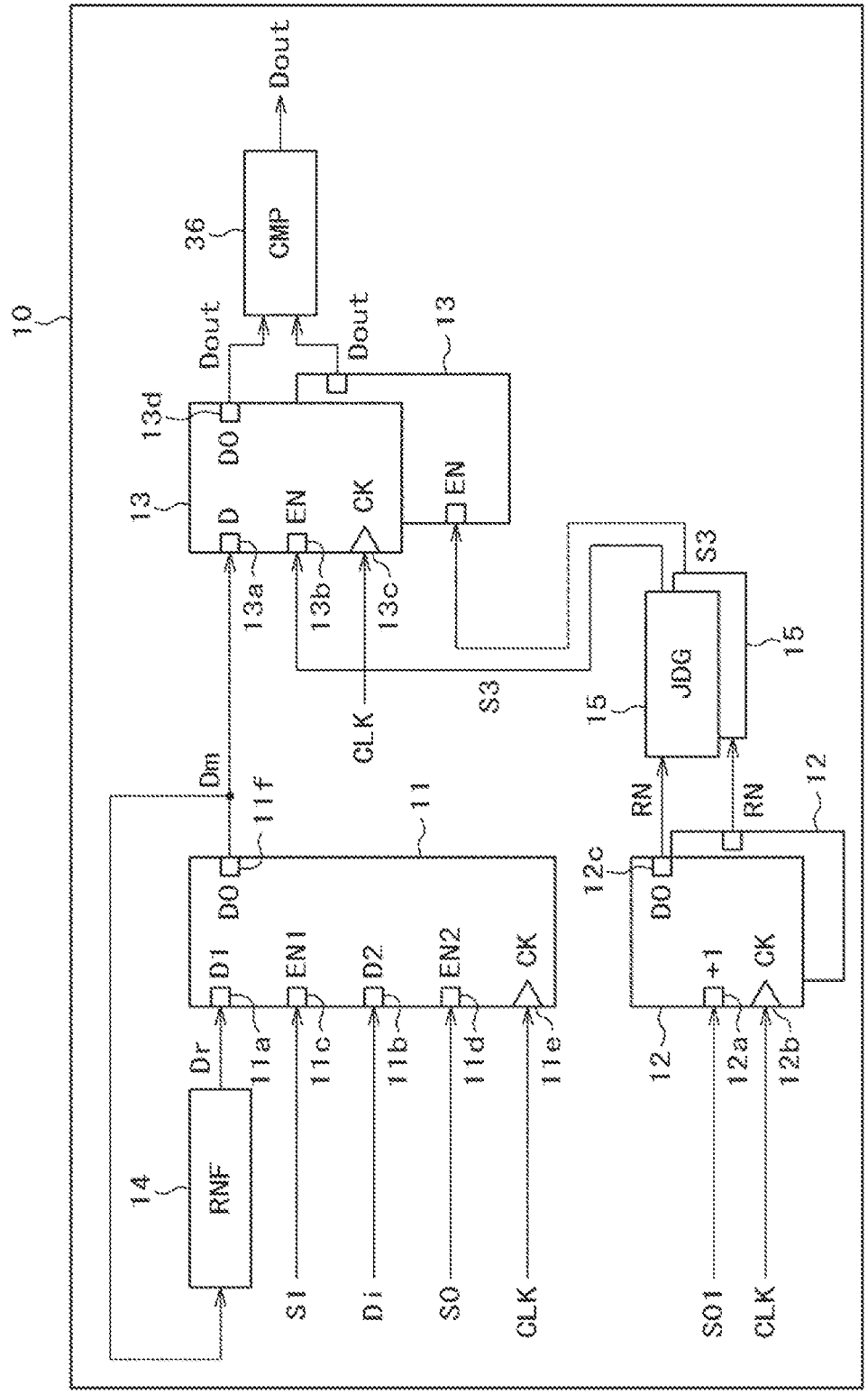
FIG. 4 is a block diagram showing a configuration of a cryptographic IP core in a third embodiment.

A cryptographic IP core in a third embodiment will be described with reference to FIG. 4. FIG. 4 is a block diagram showing a configuration of a cryptographic IP core in a third embodiment.

A cryptographic IP core 10 in a third embodiment has a configuration of duplicating: the second flip-flop 12 which is the circuit of the above-mentioned (A); the judgement circuit 15 which is the circuit of the above-mentioned (B); and the third flip-flop 13 which is the circuit of the above-mentioned (C). The cryptographic core IP10 in the third embodiment has another second flip-flop 12, another judgement circuit 15, another third flip-flop 13, and a comparison circuit (CMP) 36 with respect to the cryptographic IP core in the comparative example. The comparison circuit 36 compares outputs of the two third flip-flops 13 and outputs data (Dout), which is the output of the third flip-flop 13, if the two outputs are matched. If the two outputs are not matched, the comparison circuit 36 stops the output of the data (Dout).

If the output of the second flip-flop 12, the judgement circuit 15, or the third flip-flop 13 changes due to the fault injection attack, there is a more highly possibility that the outputs of the two third flip-flops 13 will not be matched. By detecting that the two outputs are not matched, the arithmetic result cannot be outputted from the third flip-flop 13, and the reduced round can be suppressed.

Fourth Embodiment

Figure 5:
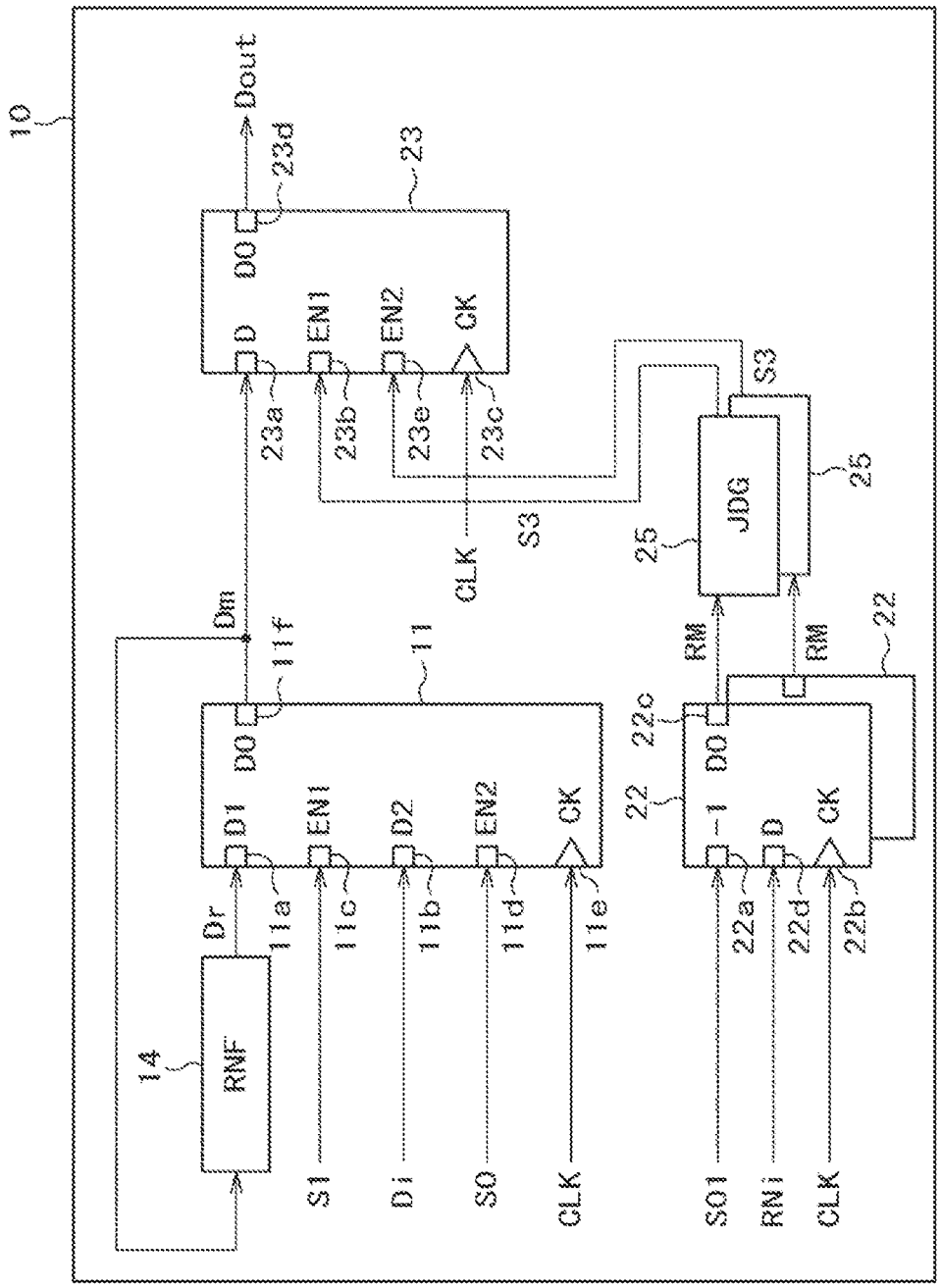
FIG. 5 is a block diagram showing a configuration of a cryptographic IP core in a fourth embodiment.

A cryptographic IP core in a fourth embodiment will be described with reference to FIG. 5. FIG. 5 is a block diagram showing a configuration of a cryptographic IP core in a fourth embodiment.

A cryptographic IP core 10 in a fourth embodiment has a configuration of duplicating the circuits of the above-mentioned (A) and the above-mentioned (B) similarly to the second embodiment. However, the cryptographic IP core 10 in the fourth embodiment replaces the second flip-flop 12 of the cryptographic IP core in the second embodiment with the second flip-flop 22, replaces the judgement circuit 15 with the judgement circuit 25, eliminates the comparison circuit 26, and replaces the third flip-flop 13 with the third flip-flop 23.

The second flip-flop 12 has a decrement enable input terminal (−1) 22a, a clock input terminal (CK) 22b, a data output terminal (DO) 22c, and a data input terminal (D) 22d. An input signal (S01) in which the signal (S0) indicating the start of the arithmetic processing and the signal (S1) indicating that the arithmetic processing is in progress are logically summed is inputted in the decrement enable input terminal (−1) 22a. The clock signal (CLK) is inputted in the clock input terminal (CK) 22b. An initial value (RNi) is inputted in the data input terminal (D) 22d. Here, the initial value (RNi) is the maximum value (RNmax) of the number of rounds corresponding to the key length.

The second flip-flop 22 captures the initial value (RNi) from the data input terminal (D) 22d when the input signal (S01) is deactivated (for example, at a low level) at the rising or falling edge of the clock signal (CLK). Further, the second flip-flop 22 captures the input signal (S01) at the rising edge or the falling edge of the clock signal (CLK). When the input signal (S01) is activated (for example, at a high level), it is decremented. The second flip-flop 22 holds a value related to the number of rounds (RM=RNmax−RN), and outputs a value related to the number of rounds (RM) from the data output terminal (DO) 22c.

The third flip-flop 23 includes a data input terminal (D) 23a, a first enable input terminal (EN1) 23b, a second enable input terminal (EN2) 23e, a clock input terminal (CK) 23c, and a data output terminal (DO) 23d. The output data (Dm) of the first flip-flop 11 is inputted in the data input terminal (D) 23a. An arithmetic end signal (S3), which is an output signal of one judgement circuit 25, is inputted to the first enable input terminal (EN1) 23b. An arithmetic end signal (S3), which is an output signal of another judgement circuit 25, is inputted in the second enable input terminal (EN2) 23e. The clock signal (CLK) is inputted to the clock input terminal (CK) 13c.

The third flip-flop 23 captures the output data (Dm) of the first flip-flop 11 from the data input terminal (D) 23a when both of the two arithmetic end signals (S3) are activated (for example, at high levels) at the rising edge or falling edge of the clock signal (CLK). The third flip-flop 13 constitutes an output buffer and outputs data (Dout) from the data output terminal (DO) 23d.

The judgement circuit 25 includes a comparison circuit for comparing the output (RM) of the second flip-flop 22 with "0", and is a circuit for determining whether the number of rounds has reached a predetermined value (maximum value). The judgment circuit 25 activates the arithmetic end signal (S3) when the number of rounds reaches the predetermined value.

The third flip-flop 23 captures the arithmetic result (Dm) when the arithmetic end signals (S3), which are the outputs of the two judgement circuits 15, are matched. When the two arithmetic end signals (S3) are not matched, the third flip-flop 23 does not capture the arithmetic result (Dm). Consequently, the comparison circuit 26 in the second embodiment becomes unnecessary.

If the output of the second flip-flop 22 or the judgement circuit 25 changes due to the fault injection attack, there is a more highly possibility that the outputs of the two judgement circuits 25 will not be matched. By detecting that the two outputs are not matched, the arithmetic result cannot be outputted from the third flip-flop 13, and the reduced round can be suppressed.

Fifth Embodiment

Figure 6:
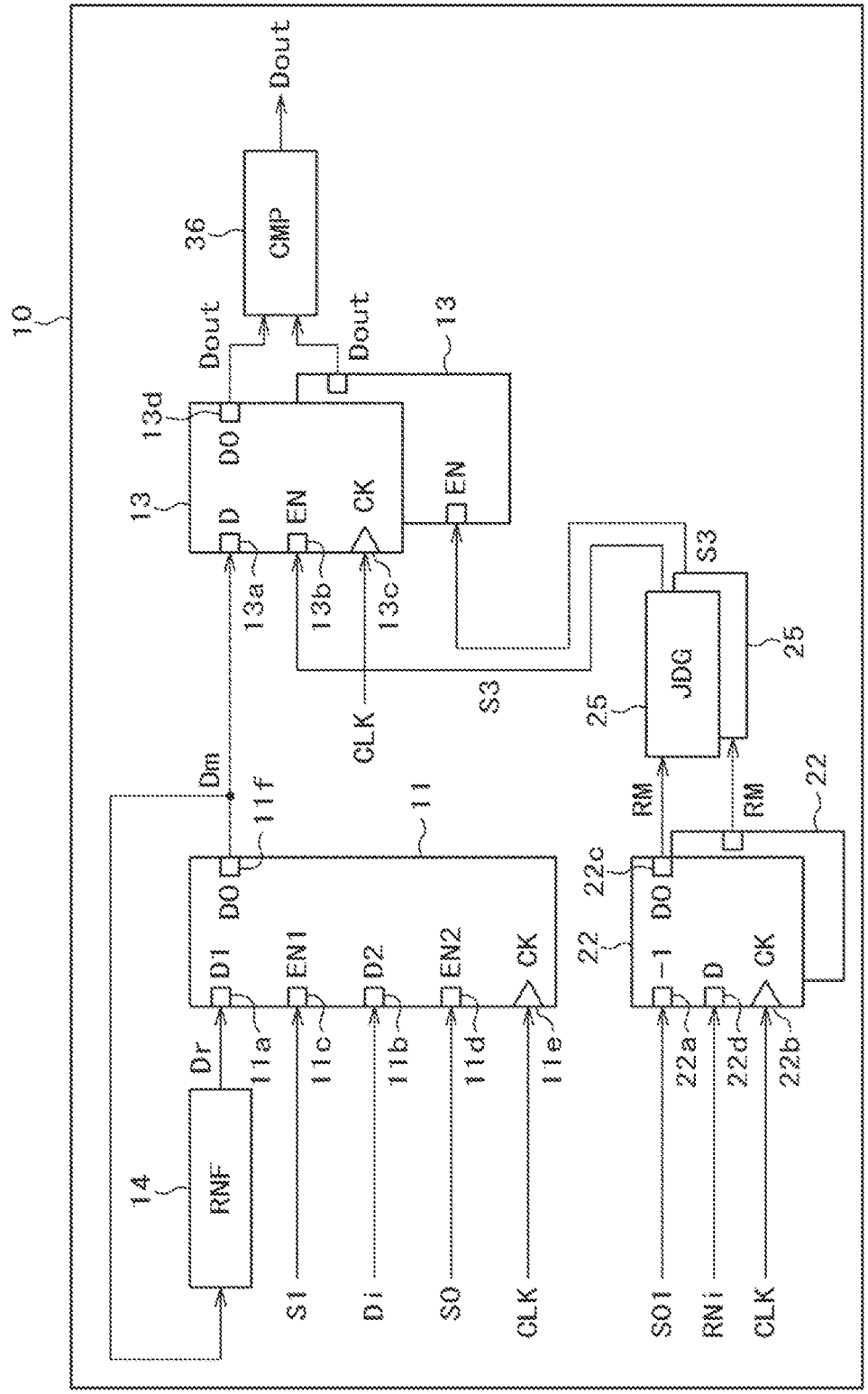
FIG. 6 is a block diagram showing a configuration of a cryptographic IP core in a fifth embodiment.

A cryptographic IP core in a fifth embodiment will be described with reference to FIG. 6. FIG. 6 is a block drawing showing a configuration of a cryptographic IP core in a fifth embodiment.

A cryptographic IP core in a fifth embodiment has a configuration of duplicating the circuits of the above-mentioned (A) and the above-mentioned (C) similarly to the third embodiment. However, the cryptographic IP core in the fifth embodiment is obtained by replacing the second flip-flop 12 of the cryptographic IP core in the third embodiment with the second flip-flop 22 in the fourth embodiment, and replacing the judgement circuit 15 with the judgement circuit 25 in the fourth embodiment.

When the output of the second flip-flop 22, judgement circuit 25, or third flip-flop 13 changes due to the fault injection attack, there is a more highly possibility that the outputs of the two third flip-flops 13 will not be matched. By detecting that the two outputs are not matched, the arithmetic result cannot be outputted from the third flip-flop 13, and the reduced round can be suppressed.

Incidentally, the cryptographic IP core in the first embodiment may be a cryptographic IP core that has a configuration of replacing the second flip-flop 12 with the second flip-flop 22 in the fourth embodiment. Further, the cryptographic IP core in the second embodiment may be a cryptographic IP core that has a configuration of replacing the second flip-flop 12 with the second flip-flop 22 in the fourth embodiment and replacing the judgement circuit 15 with the judgement circuit 25 in the fourth embodiment. Furthermore, the cryptographic IP core in the third embodiment may be a cryptographic IP core that has a configuration of the second flip-flop 12 with the second flip-flop 22 in the fourth embodiment and replacing the judgement circuit 15 with the judgement circuit 25 in the fourth embodiment. Moreover, the cryptographic IP core in the fourth embodiment may be a cryptographic IP core that has a configuration of replacing the second flip-flop circuit 22 with the second flip-flop 12 in the second embodiment and replacing the judgement circuit 25 with the judgement circuit 25 in the second embodiment.

As mentioned above, the disclosure made by the present discloser has been specifically described based on the embodiments and examples, but the present disclosure is not limited to the above-mentioned embodiments and examples and, needless to say, various changes or modifications can be made without departing from the scope thereof.

For example, in the embodiments and examples, the AES has been described as an example, but it can also be applied to a cryptographic algorithm that performs an arithmetic processing of repeating the predetermined number of loops, for example, SHA.

What is claimed is:

1. A semiconductor device comprising:
   an arithmetic circuit repeating an operation related to a cryptographic processing for a predetermined number of rounds;
   a holding circuit holding data related to the number of rounds of the operation of the arithmetic circuit;
   a judgement circuit determining whether the number of rounds is the predetermined number of rounds; and
   an output buffer circuit outputting arithmetic result data of the arithmetic circuit when the judgement circuit determines that the number of rounds is the predetermined number of rounds,
   wherein the semiconductor device is configured:
   to duplicate the holding circuit; and
   not to output the arithmetic result data when two outputs of the duplicated holding circuit are not matched.

2. The semiconductor device according to claim 1,
   wherein the semiconductor device is further configured:
   to duplicate the judgment circuit; and
   not to output the arithmetic result data when two outputs of the duplicated judgement circuit are not matched.

3. The semiconductor device according to claim 2,
   wherein the semiconductor is further configured:
   to duplicate the output buffer circuit; and
   not to output the arithmetic result data when two outputs of the duplicated output buffer circuit are not matched.

4. The semiconductor device according to claim 2,
   wherein the output buffer circuit is configured by a flip-flop circuit having a first enable input terminal and a second enable input terminal,
   wherein one output of the duplicated judgment circuit is inputted in the first enable input terminal,
   wherein another output of the duplicated judgement circuit is inputted in the second enable input terminal, and
   wherein the output buffer circuit is configured to capture the arithmetic result data when an enable condition of the first enable input terminal and the second enable input terminal are satisfied.

5. The semiconductor device according to claim 1,
   wherein the holding circuit has an increment circuit or a decrement circuit.

6. The semiconductor device according to claim 1, further comprising a comparison circuit for comparing the two outputs of the duplicated holding circuit.

7. The semiconductor device according to claim 2, further comprising a comparison circuit for comparing the two outputs of the duplicated judgement circuit.

8. The semiconductor device according to claim 3, further comprising a comparison circuit for comparing the two outputs of the duplicated output buffer circuit.

9. The semiconductor device according to claim 1, further comprising an intermediate value holding circuit for holding an intermediate arithmetic result of the arithmetic circuit,
   wherein the intermediate value holding circuit is configured to output the arithmetic result data.

* * * * *